US010294359B2

(12) United States Patent
Hustad et al.

(10) Patent No.: US 10,294,359 B2
(45) Date of Patent: *May 21, 2019

(54) COPOLYMER FORMULATION FOR DIRECTED SELF ASSEMBLY, METHODS OF MANUFACTURE THEREOF AND ARTICLES COMPRISING THE SAME

(71) Applicants: Rohm and Haas Electronic Materials LLC, Marlborough, MA (US); Dow Global Technologies LLC, Midland, MI (US)

(72) Inventors: Phillip D. Hustad, Natick, MA (US); Jieqian Zhang, Southborough, MA (US); Peter Trefonas, III, Medway, MA (US)

(73) Assignees: ROHM AND HAAS ELECTRONIC MATERIALS LLC, Marlborough, MA (US); DOW GLOBAL TECHNOLOGIES LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/944,469

(22) Filed: Nov. 18, 2015

(65) Prior Publication Data
US 2016/0186002 A1 Jun. 30, 2016

Related U.S. Application Data

(60) Provisional application No. 62/097,673, filed on Dec. 30, 2014.

(51) Int. Cl.
*C08L 53/00* (2006.01)
(52) U.S. Cl.
CPC ...... *C08L 53/00* (2013.01); *B81C 2201/0149* (2013.01)

(58) Field of Classification Search
CPC .................................................. C09D 153/00
See application file for complete search history.

(56) References Cited

U.S. PATENT DOCUMENTS 7,521,090 B1 * 4/2009 Cheng .................. B05D 5/00
427/256
8,059,350 B2 11/2011 Albrecht et al.
(Continued)

FOREIGN PATENT DOCUMENTS

JP 2005041931 A 2/2005
JP 2013079349 A 5/2013
(Continued)

OTHER PUBLICATIONS

Verduzco et al. "Structure, function, self-assembly, and applications of bottlebrush copolymers"; Chem. Soc. Rev; 44; 2015, pp. 2405-2420.
(Continued)

*Primary Examiner* — Arrie L Reuther
(74) *Attorney, Agent, or Firm* — Cantor Colburn LLP

(57) ABSTRACT

Disclosed herein is a composition comprising a block copolymer; where the block copolymer comprises a first polymer and a second polymer; where the first polymer and the second polymer of the block copolymer are different from each other and the block copolymer forms a phase separated structure; an additive polymer comprising a polymer wherein the surface tension of the polymer with the first polymer and the surface tension of the polymer with the second polymer are both lower than the surface tension between the first polymer and second polymer; where the additive polymer comprises a reactive functional moiety that forms a bond or a complex or a coordinate with the substrate
(Continued)

upon being disposed on the substrate; where the reactive functional moiety is unreacted when it is a part of the composition; and a solvent.

9 Claims, 9 Drawing Sheets

(56) References Cited

U.S. PATENT DOCUMENTS

| | | | |
|---|---|---|---|
| 8,101,261 B2 | 1/2012 | Millward et al. | |
| 8,343,578 B2 | 1/2013 | Kim et al. | |
| 8,716,151 B2 | 5/2014 | Zhang et al. | |
| 8,821,738 B2 | 9/2014 | Hustad | |
| 8,822,615 B1 | 9/2014 | Trefonas | |
| 2005/0112886 A1 | 5/2005 | Asakawa et al. | |
| 2006/0134556 A1* | 6/2006 | Nealey | B81C 1/00031 430/311 |
| 2007/0175859 A1* | 8/2007 | Black | B81C 1/00031 216/41 |
| 2008/0257187 A1 | 10/2008 | Millward | |
| 2008/0311402 A1 | 12/2008 | Jung et al. | |
| 2009/0087653 A1 | 4/2009 | Nealey et al. | |
| 2009/0179002 A1 | 7/2009 | Cheng et al. | |
| 2009/0181171 A1* | 7/2009 | Cheng | B05D 5/02 427/256 |
| 2009/0260750 A1 | 10/2009 | Nealey | |
| 2011/0147983 A1 | 6/2011 | Cheng et al. | |
| 2012/0135159 A1 | 5/2012 | Xiao et al. | |
| 2012/0202017 A1 | 8/2012 | Nealey et al. | |
| 2013/0189504 A1* | 7/2013 | Nealey | B82Y 30/00 428/201 |
| 2013/0209344 A1 | 8/2013 | Chang | |
| 2013/0209694 A1* | 8/2013 | Chang | B05D 3/02 427/379 |
| 2013/0209696 A1 | 8/2013 | Sharma et al. | |
| 2013/0209755 A1 | 8/2013 | Hustad et al. | |
| 2014/0141375 A1 | 5/2014 | Cho | |
| 2014/0142249 A1 | 5/2014 | Cho | |
| 2014/0142252 A1 | 5/2014 | Cho | |
| 2014/0227448 A1* | 8/2014 | Trefonas | C09D 153/00 427/385.5 |
| 2014/0273511 A1 | 9/2014 | Farrell et al. | |
| 2014/0287266 A1* | 9/2014 | Watanabe | G11B 5/743 428/800 |
| 2014/0349486 A1 | 11/2014 | Sills et al. | |
| 2014/0377518 A1 | 12/2014 | Trefonas, III et al. | |
| 2014/0378592 A1 | 12/2014 | Trefonas, III et al. | |
| 2015/0184024 A1 | 7/2015 | Chang | |
| 2015/0240110 A1 | 8/2015 | Willson et al. | |
| 2016/0024246 A1 | 1/2016 | Mahanthappa et al. | |
| 2016/0186001 A1 | 6/2016 | Hustad et al. | |
| 2016/0186003 A1 | 6/2016 | Hustad et al. | |
| 2016/0186004 A1 | 6/2016 | Hustad et al. | |
| 2016/0251508 A1 | 9/2016 | Hustad et al. | |
| 2016/0251538 A1 | 9/2016 | Hustad et al. | |
| 2016/0251539 A1 | 9/2016 | Hustad et al. | |
| 2016/0254141 A1 | 9/2016 | Hustad et al. | |

FOREIGN PATENT DOCUMENTS

| | | |
|---|---|---|
| KR | 20110018678 A | 2/2011 |
| TW | I460530 B | 11/2014 |
| WO | 2013011314 A1 | 1/2013 |

OTHER PUBLICATIONS

Mitra et al.; "Thin Film Phase Behavior of Bottlebrush/Linear Polymer Blends"; Macromolecules; 47; 2014, pp. 5269-5276.
Edwards et al.; "Precise Control over Molecular Dimensions of Block-Copolymer Domains Using the Interfacial Energy of Chemically Nanopatterned Substrates"; Adv. Mater.; 16, No. 15; Aug. 4, 2004, 1315-1319.
Kim et al.; "Epitaxial self-assembly of block copolymers on lithographically defined nanopatterned substrates"; Nature; vol. 424; Jul. 24, 2003, p. 411-414.
Ruiz et al.; "Density Multiplication and Improved Lithography by Directed Block Copolymer Assembly"; Science; vol. 321; Aug. 15, 2008, pp. 936-939.
Bosse, et al. "Microdomain Ordering in Laterally Confined Block Copolymer Thin Films", Macromolecules 40, 9570 (2007).
Grimaud, et al. "Controlled/"Living" Radical Polymerization of Methyl Methacrylate by Atom Transfer Radical Polymerization" in Macromolecules 1997, 30, 2216-2218.
Gu, et al. "Self-Assembly of Symmetric brush Diblock Copolymers", ACS Nano, 7(3), 2551, 2013.
Gurr, et al. "Polyimide polydimethylsiloxane triblock copolymers for thin film composite gas separation membranes" J Polym Sci Pol Chem 2014, 52, 3372-3382.
Han, et al., "Effect of Composition of Substrate-Modifying Random Copolymers on the Orientation of Symmetric and Asymmetric Diblock Copolymer Domains," Macromolecules, 2008, 41 (23), pp. 9090-9097.
Hong, et al. "On the Self-Assembly of Brush Block Copolymers in Thin Films", ACS Nano, 7(11), 9684, 2013.
Iwama, et al. "Computational Studies of Shape Rectification in Directed Self-Assembly", Proc. SPIE, 9049, 904927 (2014).
Iwama, et al. "The Hole Shrink Problem: Directed Self-Assembly Using Self-Consistent Field Theory", J. Photopolymer Science & Technology 26, 15-20 (2013).
Ji, et al. "Molecular Transfer Printing Using Block Copolymers" ACS Nano, 2010, 4 (2), pp. 599-609.
Ji, et al. "Preparation of neutral wetting brushes for block copolymer films from homopolymer blends", Advanced Materials, 2008, 20, 3054-3060.
Kim, B. "Defectivity Study of Directed Self-Assembly of Cylindrical Diblock Copolymers in Laterally Confined Thin Channels", Proc. of SPIE, 8680, 868016 (2013).
Kim, B. et al. "Thermodynamic and Kinetic Aspects of Defectivity in Directed Self-Assembly of Cylinder-Forming Diblock Copolymers in Laterally Confining Thin Channels", J. Appl. Polym. Sci., 131, 40790 (2014).
Laachi et al. "Field-Theoretic Simulations of Directed Self-Assembly in Cylindrical Confinement: Placement and Rectification Aspects", Proc. SPIE, 9049, 90491M (2014).
Laachi, et al. "Directed Self-Assembly of Diblock Copolymers in Laterally Confining Channels: Effect of Rough Surfaces on Line-Edge Roughness (LER) and Defectivity", Proc. SPIE, 9049, 90491D (2014).
Laachi, et al. "The Hole Shrink Problem: Theoretical Studies of Directed Self-Assembly in Cylindrical Confinement", Proc. of SPIE 8680, 868014 (2013).
Le, D., et al. "Synthesis of Well-Defined ω-Oxanorbornenyl Poly-(ethylene oxide) Macromonomers via Click Chemistry and Their Ring-Opening Metathesis Polymerization" Macromolecules 2010, 43, 5611-5617.
Liu, et al. "Fabrication of Lithographically Defined Chemically Patterned Polymer Brushes and Mats" Macromolecules, 2011, 44 (7), pp. 1876-1885.
Macfarlane, et al. "Improving Brush Polymer Infrared 1-D Photonic Crystals via Linear Polymer Additives", J. Am. Chem. Soc., 2014, 136 (50), pp. 17374-17377.
Mansky, et al "Controlling Polymer-Surface Interactions with Random Copolymer Brushes" Science 1997, 275 (5305), 1458-1460.
Mansky, et al. "Ordered Diblock Copolymer Films on Random Copolymer Brushes" Macromolecules 1997, 30 (22), 6810-6813.
Takahashi, et al. "Defectivity in Laterally Confined Lamella-Forming Diblock Copolymers: Thermodynamic and Kinetic Aspects", Macromolecules 45, 6253-6265 (2012).
Trefonas, et al. "Bottom-up/top-down, high-resolution, high-throughput lithography using vertically assembled block bottle brush polymers" J. Micro/Nanolith. MEMS MOEMS. 12(4), 043006 (Dec. 16, 2013).
Laachi, et al. "Self-Consistent Field Theory Investigation of Directed Self-Assembly in Cylindrical Confinement", J. Polym. Sci. B Polym. Phys.; 2015, 12 pages.

(56) References Cited

OTHER PUBLICATIONS

Borah et al.; "Orientation and Alignment Control of Microphase-Separated PS-b-PDMS Substrate Patterns via Polymer Brush Chemistry"; ACS Appl. Mater. Interfaces; 5; 2013, 88-97.

* cited by examiner

COPOLYMER FORMULATION FOR DIRECTED SELF ASSEMBLY, METHODS OF MANUFACTURE THEREOF AND ARTICLES COMPRISING THE SAME

CROSS REFERENCE TO RELATED APPLICATION

This U.S. Non-Provisional application claims the benefit of U.S. Provisional Application Ser. No. 62/097,673 filed 30 Dec. 2014, the entire contents of which are hereby incorporated by reference.

BACKGROUND

This disclosure relates to a copolymer formulation for directed self-assembly, methods of manufacture thereof and to articles comprising the same.

Directed self-assembly (DSA) of block copolymers has been identified as a candidate technology to extend the state of current optical lithography. In DSA, small pitch sizes are achieved by directing the self-assembled block copolymer nanodomains to a lithographically patterned substrate. One of the leading methods today for DSA involves a chemical pattern to align a lamellar morphology of a block copolymer, such as polystyrene-block-poly(methyl methacrylate), or PS-b-PMMA. The preferred process scheme, shown in FIG. 1, begins by patterning an array of sparse guide stripes generally manufactured from a crosslinked polystyrene mat. After the stripes are etched (also termed "etch trimming") to the proper dimension, the brush is coated over the stripes, baked to induce chemical grafting, and then excess brush is removed by rinsing to leave relatively flat substrate with chemical contrast. The substrate is then treated with a block copolymer, which after annealing aligns to the substrate to multiply the density of the initial pattern. In this two-step method that involves first applying the brush followed by applying the block copolymer (BCP), the composition of the brush has to be controlled over a fairly tight range in order to achieve good DSA results.

It is therefore desirable to use compositions where the alignment between domains can be easily achieved and where the ranges of the polymers are not so tightly controlled.

SUMMARY

Disclosed herein is a composition comprising a block copolymer; where the block copolymer comprises a first polymer and a second polymer; where the first polymer and the second polymer of the block copolymer are different from each other and the block copolymer forms a phase separated structure; an additive polymer comprising a polymer wherein the surface tension of the polymer with the first polymer and the surface tension of the polymer with the second polymer are both lower than the surface tension between the first polymer and second polymer; where the additive polymer comprises a reactive functional moiety that forms a bond or a complex or a coordinate with the substrate upon being disposed on the substrate; where the reactive functional moiety is unreacted when it is a part of the composition; and a solvent.

Disclosed herein too are articles manufactured from the aforementioned composition.

DETAILED DESCRIPTION

Figure 1:
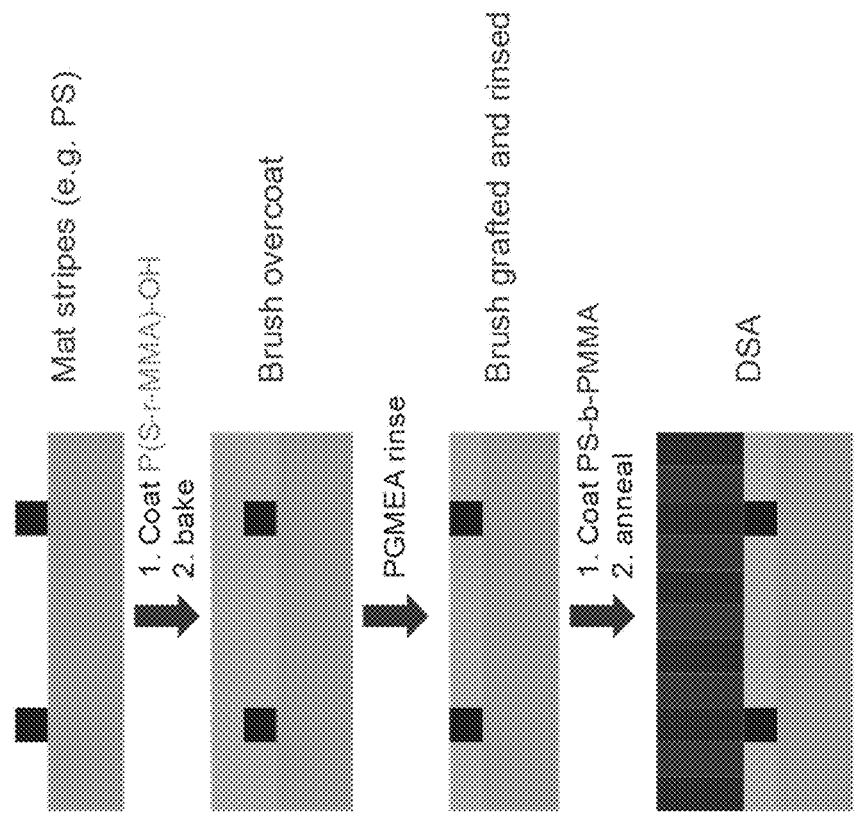
FIG. 1 is a schematic depiction of a prior art method that involves domain alignment by first applying the brush followed by applying the block copolymer.

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 400° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first polymer derived from polymerization of a first monomer and a second polymer derived from polymerization of a second monomer that forms domains through phase separation. "Domain", as used herein, means a compact crystalline, semi-crystalline, or amorphous region formed by corresponding blocks of the block copolymer, where these regions may be lamellar, cylindrical, or spherical and are formed orthogonal or perpendicular to the plane of the surface of the substrate. Perpendicularly oriented lamellae provide nanoscale line patterns, while there is no nanoscale surface pattern created by parallel oriented lamellae. Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns, whereas cylinders that form perpendicular to the surface form nanoscale hole patterns. Therefore, to form a useful pattern, control of the orientation of the self-assembled microdomains in the block copolymer is desirable. In an embodiment, the domains may have an average largest dimension of about 1 to about 25 nanometers (nm), specifically about 5 to about 22 nm, and still more specifically about 7 to about 20 nm.

The term "$M_n$" used herein and in the appended claims in reference to a block copolymer of the present invention is the number average molecular weight of the block copolymer (in g/mol) determined according to the method used herein in the Examples.

The term "$M_w$" used herein and in the appended claims in reference to a block copolymer of the present invention is the weight average molecular weight of the block copolymer (in g/mol) determined according to the method used herein in the Examples.

The term "PDI" or "Ð" used herein and in the appended claims in reference to a block copolymer of the present invention is the polydispersity (also called polydispersity index or simply "dispersity") of the block copolymer determined according to the following equation:

$$PDI=M_w/M_n.$$

The transition term "comprising" is inclusive of the transition terms "consisting of" and "consisting essentially of".

The term "and/or" is used herein to mean both "and" as well as "or". For example, "A and/or B" is construed to mean A, B or A and B.

The terms "brush" or "brush polymer" are used herein to describe a polymer containing a reactive functional group that capable of reacting with a functional group upon the surface of the substrate to form a layer of polymer chains attached to the substrate. The terms "mat" or "mat-like film" are used to describe a polymeric layer on a substrate formed by disposing a polymer having reactive substituents along the chain backbone capable of reacting either with itself or a crosslink-inducing additive to form bonds or crosslinks between individual chains of the polymer after it is disposed upon the substrate. A brush polymer is one where the chain backbone is oriented perpendicular to the substrate while a mat polymer is one where the chain backbone is oriented parallel to the substrate.

A random copolymer as used herein comprises two or more polymers where each polymer may comprise a single unit or a plurality of successive repeat units along the copolymer chain back bone. Even though some of the units along the copolymer chain backbone exist as single units, these are referred to as polymers herein. For example, the random copolymer referred to herein is detailed as comprising a third polymer and a fourth polymer even though the third polymer may exist as single units in certain segments along the copolymer chain backbone.

Disclosed herein is a composition (also referred to herein sometimes as a solution) comprising a block copolymer and an additive polymer that facilitates directed self-assembly of the polymer domains. In an embodiment, the composition comprises an intimate mixture of the complete volumes of the block copolymer and the additive polymer without either the block copolymer and the additive polymer undergoing phase separation. In another embodiment, the composition comprises a solvent in addition to the block copolymer and the additive polymer. The solvent is compatible with one or both of the block copolymer and the additive polymer.

The block copolymer comprises a first polymer and a second polymer, while the additive polymer may comprise either a single polymer or multiple polymers that are covalently bonded to a reactive group. The reactive group can react with the substrate to form a bond (e.g., a covalent linkage) or otherwise a complex or a coordinate (e.g. hydrogen or ionic bond) to the substrate to function as a brush polymer. In one embodiment, the additive polymer may be a single polymer or copolymer that has a free energy (or a surface tension) that lies between that of the first polymer and the second polymer. In another embodiment, the additive polymer may comprise in addition to the reactive functionality, a single polymer that has a surface tension that is equal to the surface tension of either the first polymer or the second polymer of the block copolymer.

In another embodiment, the additive polymer (in addition to the reactive functionality) may be a polymer comprising a third polymer that is chemically identical with or substantially chemically similar to the first polymer of the block copolymer and a fourth polymer that is chemically identical with or substantially chemically similar to the second polymer of the block copolymer. In yet another embodiment, the additive polymer (in addition to the reactive functionality) may be a polymer that comprises only a single polymer (e.g., a third polymer) that is chemically identical with or substantially chemically similar to the first polymer of the block copolymer or that is chemically identical with or substantially chemically similar to the second polymer of the block copolymer.

In one embodiment, the additive polymer is a random copolymer that comprises different polymers where the surface energy of the respective polymers are higher and lower than those of the individual polymers of the block copolymer, but where the average surface energy of the additive polymer lies between that of the first polymer and the second polymer of the block polymer. In another embodiment, the additive polymer comprises a polymer wherein the surface tension of the polymer with the first polymer (of the block copolymer) and the surface tension of the polymer with the second polymer (of the block copolymer) are both lower than the surface tension between the first polymer and second polymer.

In another embodiment, the additive polymer is a homopolymer that happens to have a surface energy that lies approximately in between the surface energy of the first and second polymers of the block copolymer can be used as the additive polymer.

Prior to being disposed on the substrate, the entire volume of the additive polymer (with the reactive group being in an unreacted state i.e., it is not reacted with the substrate) and the entire volume of the block copolymer are intimately mixed together with a solvent in a vessel and in this blended state the domains of the block copolymer are not segregated (i.e., they are not phase separated) from each other or from the additive polymer. After being disposed on the substrate, the additive polymer segregates from the block copolymer and reacts with the substrate. In addition, the domains of the block copolymer phase separate from each other either horizontally or vertically.

When the domains of the block copolymer phase separate to form cylinders, the longitudinal axis of the cylinders can be parallel to the substrate or perpendicular to the substrate. When the domains of the block copolymer phase separate to form lamellae, at least one of the longitudinal axis of the lamellae is perpendicular to the substrate.

The additive polymer functions as a substrate modification layer of the FIG. 1 and enables the separation of the block copolymer into lamellar or cylindrical domains after the composition is disposed on a substrate. By mixing the additive polymer with the block polymer prior to deposition on a substrate that is to be etched, the additive polymer functions as an embedded substrate modification layer—i.e., it separates from the composition after deposition on a substrate and the reactive group reacts with the substrate. By having the additive polymer comprise a polymer that has a surface tension that lies between the first and the second polymers of the block copolymer or by having an additive polymer comprise a copolymer comprising the same or similar polymers as the first and second monomers used to form the block copolymer, the composition can facilitate directed self-assembly of the polymer domains when cast upon a substrate. The mixing of the additive polymer with the block copolymer prior to deposition on a substrate permits the use of a one-step process for manufacturing patterns on substrates.

Disclosed herein too is a method of using the aforementioned composition to facilitate the directed self-assembly of the polymer domains of the composition. The method comprises blending the additive polymer and the block copolymer together and applying them in a single coating and annealing step or alternatively, in a series of coating and annealing steps. This method is versatile and robust in that it permits a range of compositions (e.g., a range of polymer molecular weights and a range of weight percents) to be used for the block and additive polymers, while providing for better domain alignment than that which can be achieved by the process depicted in the FIG. 1. Surprisingly, this process not only simplifies the process by reducing the number of coat and bake steps, but the process window to achieve good directed self assembly is significantly improved over the two-step process that is detailed in the FIG. 1 and that is presently used in industry.

As detailed above, the composition includes a block copolymer and an additive polymer where the polymers that form the block copolymer are either similar or substantially similar in chemical character to the polymers that are used in the additive polymer.

The first polymer and the second polymer are chemically different from one another and are arranged in blocks in the block copolymer. The block copolymer can be a multiblock copolymer. In one embodiment, the multiblocks can include diblocks, triblocks, tetrablocks, and so on. The blocks can be part of a linear copolymer, a branched copolymer where the branches are grafted onto a backbone (these copolymers are also sometimes called "comb copolymers"), a star copolymer, or the like. The blocks can also be arranged in gradients, where the blocks are arranged in increasing molecular weight from one end of the polymer chain to the other end. In an exemplary embodiment, the block copolymer is a linear diblock copolymer.

The first polymer or the second polymer of the block copolymer and of the additive polymer are different from one another and may be a polystyrene, a poly(meth)acrylate, a polyacetal, a polyolefin, a polyacrylic, a polycarbonate, a polyester, a polyamide, a polyamideimide, a polyarylate, a polyarylsulfone, a polyethersulfone, a polyphenylene sulfide, a polyvinyl chloride, a polysulfone, a polyimide, a polyetherimide, a polyetherketone, a polyether etherketone, a polyether ketone ketone, a polybenzoxazole, a polyphthalide, a polyanhydride, a polyvinyl ether, a polyvinyl thioether, a polyvinyl alcohol, a polyvinyl ketone, a polyvinyl halide, a polyvinyl nitrile, a polyvinyl ester, a polysulfonate, a polysulfide, a polythioester, a polysulfone, a polysulfonamide, a polyurea, a polyphosphazene, a polysilazane, a polybenzothiazole, a polypyrazinoquinoxaline, a polypyromellitimide, a polyquinoxaline, a polybenzimidazole, a polyoxindole, a polyoxoisoindoline, a polydioxoisoindoline, a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, polysiloxane, or the like, or a combination comprising at least one of the foregoing polymers.

Exemplary block copolymers that are contemplated for use include diblock or triblock copolymers such as poly (styrene-b-vinyl pyridine), poly(styrene-b-butadiene), poly (styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly (styrene-b-isoprene-b-ethylene oxide), poly(styrene-b-dimethylsiloxane), poly(styrene-b-trimethylsilylmethyl methacrylate), poly(methyl methacrylate-b-dimethylsiloxane), poly(methyl methacrylate-b-trimethylsilylmethyl methacrylate), or the like, or a combination comprising at least one of the foregoing block copolymers.

In an embodiment, the additive polymer is a random copolymer where the surface tension of the copolymer lies between the surface tension of the first polymer and that of the second polymer. Exemplary additive polymers that are contemplated for use include polymers such as poly(aromatics) and poly(alkenyl aromatics) (polystyrene, poly(t-butylstyrene) poly(2-vinyl pyridine), and the like), poly (alkyl (meth)acrylates) (poly(methyl methacrylate, poly (ethyl methacrylate, poly(trimethylsilylmethyl methacrylate), and the like), polybutadiene, polyisoprene, polysiloxanes (polydimethylsiloxane, poly(methylphenylsiloxane); or copolymers such as poly(styrene-r-vinyl pyridine), poly(styrene-r-butadiene), poly(styrene-r-isoprene), poly(styrene-r-methyl methacrylate), poly(t-butylstyrene-r-methyl methacrylate)poly(styrene-r-alkenyl aromatics), poly(isoprene-r-ethylene oxide), poly(styrene-r-(ethylene-propylene)), poly(ethylene oxide-r-caprolactone), poly (butadiene-r-ethylene oxide), poly(styrene-r-t-butyl (meth) acrylate), poly(methyl methacrylate-r-t-butyl methacrylate), poly(ethylene oxide-r-propylene oxide), poly(styrene-r-tetrahydrofuran), poly(styrene-r-isoprene-r-ethylene oxide), poly(styrene-r-dimethylsiloxane), poly(t-butylstyrene-r-dimethylsiloxane), poly(styrene-r-trimethylsilylmethyl methacrylate), poly(methyl methacrylate-r-dimethylsiloxane), poly(methyl methacrylate-r-trimethylsilylmethyl methacrylate), or the like, or a combination comprising at least one of the foregoing additive polymers.

In an embodiment, the additive polymer comprises a polymer that is chemically identical with the first polymer or the second polymer. In this event, the polymer used in the additive polymer may be selected from the list of polymers detailed above. In an embodiment, the polymer used in the additive polymer is not chemically identical with but is substantially similar to the first polymer or to the second polymer.

The additive polymers are functionalized with a reactive group to facilitate bond formation or complexation or coordination with the substrate that the composition is disposed on. The reactive groups are detailed below.

In an embodiment, the first polymer of the block copolymer and of the additive polymer (when it is a random copolymer) is a vinyl aromatic polymer (e.g., polystyrene or its derivatives), while the second polymer is an ethylenically unsaturated polymer (e.g., an acrylate polymer or its derivatives). The first polymer is derived from a vinyl aromatic monomer having the structure of formula (1):

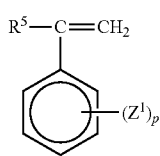

wherein $R^5$ is hydrogen, an alkyl or halogen; $Z^1$ is hydrogen, halogen, a hydroxyl or an alkyl; and p is from 1 to about 5.

The vinyl aromatic monomers that can be polymerized to produce the first polymer of the copolymer of the block copolymer and/or of the additive polymer are styrenes, alkylstyrenes, hydroxystyrenes or chlorostyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, p-tert-butylstyrene, 4-tert-butylstyrene, or the like, or a combination comprising at least one of the foregoing alkylstyrene monomers. An exemplary first polymer (for both the block copolymer and the additive polymer) is polystyrene or poly(4-tert-butylstyrene).

As noted above, the first polymer of the block copolymer can be either similar or substantially similar in chemical character to a third polymer that is used in the additive polymer. When the first polymer of the block copolymer is substantially similar in chemical character to a third polymer that is used in the additive polymer, the first polymer of the block copolymer can be one of a styrene, an alkylstyrene, a hydroxystyrene or a chlorostyrene, while the third polymer of the additive polymer can be one of a styrene, an alkylstyrene, a hydroxystyrene or a chlorostyrene so long as the first polymer of the block copolymer is not chemically identical with the third polymer of the additive polymer. In other words, while the first polymer of the block copolymer is not chemically identical with the third polymer of the additive polymer, the two form polymers that are chemically compatible with one another (i.e., they are miscible with one another in all proportions).

The molecular weight of the first polymer of the block copolymer is selected based upon the target pitch of the copolymer when it is disposed upon a substrate. The pitch is the average center to center distance between successive domains of a particular block when the composition is disposed upon a substrate. The pitch generally increases with increasing molecular weight and so controlling the molecular weight of the first polymer can be used to control the pitch. In a preferred embodiment, the weight average molecular weight ($M_w$) of the first polymer is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min).

The polydispersity index of the first polymer is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min).

The second polymer of the block copolymer and of the additive polymer (when it is a copolymer) is derived from the polymerization of an acrylate monomer. In one embodiment, the second polymer is obtained from the polymerization of units having a structure represented by formula (2):

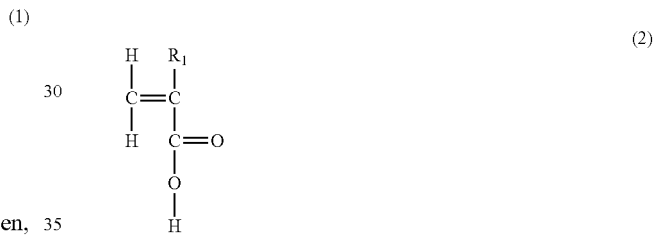

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, butyl acrylate, or the like, or a combination comprising at least one of the foregoing acrylates.

In one embodiment, the second polymer has a structure derived from a monomer having a structure represented by the formula (3):

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the (α-alkyl)acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates. The term "(α-alkyl)acrylate" implies that either an acrylate or (α-alkyl)acrylate is contemplated unless otherwise specified.

As noted above, the second polymer of the block copolymer can be either similar or substantially similar in chemical character to the second polymer that is used in the additive polymer (when it is a random copolymer) or to the single polymer that is used in the additive polymer (when it is not a random copolymer). In an embodiment, the second polymer of the block copolymer can be one of an acrylate or an alkyl acrylate, while the second polymer of the additive polymer can be one of an acrylate or an alkyl acrylate so long as the second polymer of the block copolymer is not chemically identical with the second polymer of the additive polymer. In other words, while the second polymer of the block copolymer is not chemically identical with the second polymer of the additive polymer, the two are chemically compatible with one another (i.e., they are miscible with one another in all proportions).

The weight average molecular weight ($M_w$) of the second polymer is about 2 kg/mol to about 200 kg/mol, specifically about 5 kg/mol to about 100 kg/mol and more specifically about 7 kg/mol to about 50 kg/mol grams per mole as measured by multi-angle laser light scattering (MALLS) gel permeation chromatography (GPC) instrument using THF as the mobile phase at a flow of 1 milliliter per minute (mL/min). The polydispersity index of the second polymer is less than or equal to about 1.20, specifically less than or equal to about 1.10 and specifically less than or equal to about 1.08 when determined by size exclusion chromatography (SEC) with chloroform as the mobile phase (at 35° C. and a flow rate of 1 mL/min). In order to convert a weight average molecular weight to a number average molecular weight, the weight average molecular weight as measured by gel permeation chromatography (GPC) instrument using THF as the mobile phase at a flow of 1 milliliter per minute (mL/min) is divided by the polydispersity index as determined by size exclusion chromatography (SEC) with chloroform as the mobile phase (at 35° C. and a flow rate of 1 mL/min).

The first polymer comprises about 15 to about 85 volume percent of the block copolymer, which when disposed on the substrate can form either line/space or hole/post patterns. When line space patterns are desired, the first block copolymer is selected with a composition and molecular weight that result in formation of a lamellar morphology when disposed singularly on a substrate and annealed to form domains. The first polymer is present in the first block copolymer in an amount sufficient to form a lamellar-type pattern, 35 to 65 wt %, specifically 40 to 60 wt %, based on the total weight of the block copolymer. Accordingly, the second polymer is present in the first block copolymer in an amount of 65 to 35 wt %, specifically 60 to 40 wt %, based on the total weight of the block copolymer.

When hole or post patterns (when the block copolymer phase segregates to form cylinders) are desired, the block copolymer is selected from a composition and molecular weight that result in formation of a cylindrical morphology when disposed singularly on a substrate and annealed to form domains. The first polymer is present in the first block copolymer in an amount sufficient to form a cylindrical morphology, in an amount of 15 to 35 wt %, specifically 20 to 30 wt %, based on the total weight of the block copolymer. Accordingly, the second polymer is present in the first block copolymer in an amount of 85 to 65 wt %, specifically 80 to 70 wt %, based on the total weight of the block copolymer. In an exemplary embodiment, it may be seen that a block copolymer comprising polystyrene and polymethylmethacrylate produces vertical lamellar domains when the polystyrene is present in an amount of 45 to 55 mole percent, based on the total number of moles of the block copolymer. In another exemplary embodiment, it may be seen that a block copolymer comprising polystyrene and polymethylmethacrylate produces vertical cylindrical domains when the polystyrene is present in an amount of 20 to 35 mole percent, based on the total number of moles of the block copolymer.

The polydispersity index of the block copolymer is less than or equal to about 1.20, specifically less than or equal to about 1.15 and specifically less than or equal to about 1.10 when determined by size exclusion chromatography (SEC) with chloroform as the mobile phase (at 35° C. and a flow rate of 1 mL/min).

The weight average molecular weight of the block copolymer is about 2 to about 200, more specifically about 3 to about 150 kilograms per mole as determined using multi-angle laser light scattering gel permeation chromatography and the polydispersity index. In an exemplary embodiment, it is desirable for the block copolymer to have a weight average molecular weight of about 5 to about 120 kilograms per mole.

The block copolymer has an interdomain spacing as measured by small angle xray scattering of less than or equal to about 40 nanometers, specifically less than or equal to about 35 nanometers, more specifically less than or equal to about 32 nanometers, and more specifically less than or equal to about 30 nanometers.

In an embodiment, the composition may comprise two or more block copolymers—a first block copolymer, a second block copolymer, a third block copolymer, and so on, where each block copolymer has a different molecular weight or volume percent. In an exemplary embodiment, the composition may comprise two block copolymers—a first block copolymer and a second block copolymer, each of which comprise the same first polymer and the same second polymer, but where the first block copolymer has a different molecular weight or volume percent from the second block copolymer. In an embodiment, the first block copolymer has a lower molecular weight than the second block copolymer.

In another embodiment, the composition may comprise two or more block copolymers—a first block copolymer and a second block copolymers, where at least one of the polymers—either the first polymer and/or the second polymer of the first block copolymer are not chemically identical with the first polymer and/or second polymer of the second block copolymer but are chemically compatible with one another (i.e., they are miscible with one another in all proportions). For example, the composition may comprise two block copolymers and an additive polymer. The first block copolymer comprises polystyrene and polymethylmethacrylate blocks, while the second block copolymer comprises polyhydroxystyrene and polymethylmethacrylate and has a different molecular weight from the first block copolymer. The additive polymer can comprise, for example, styrene and methylmethacrylate or ethylmethacrylate. In an exemplary embodiment, the composition comprises two block copolymers having identical first polymers and identical second polymers but having different molecular weights.

The block copolymer is present in the composition in a weight ratio of 1:1 to 30:1 relative to the additive polymer. In a preferred embodiment, the block copolymer is present in the composition in a weight ratio of 2:1 to 5:1 relative to the additive polymer.

As detailed above, in one embodiment, the additive polymer comprises at least two polymers that are chemically identical to the two polymers of the block copolymer, but that are randomly arranged along the polymer backbone. In other embodiment, one or both polymers of the additive polymer can be chemically different from one or both monomers used to make the block copolymer but their respective polymers have a chemical affinity (i.e., they are miscible with one another in all proportions) for the one or both polymers of the block copolymer. The additive polymer generally has one or more reactive groups that can facilitate a reaction with the substrate (i.e., between the additive polymer and the substrate) but does not undergo reaction with itself or other components of the additive polymer (in other words, it does not become crosslinked after processing on the substrate). In this fashion, the additive polymer forms a brush layer with self-limiting thickness. In an exemplary embodiment, the reactive end group can be a hydroxyl moiety, an ester moiety, a carboxylic acid moiety, an amine moiety, a thiol moiety, or the like.

In an embodiment, the additive polymer functions as an embedded substrate modification layer (when disposed on a substrate) and can be characterized as having a surface tension that lies between the individual surface tension of the respective polymers that comprise the blocks of the block copolymer. In other words, the surface free energy of the additive polymer lies between the surface free energy of the first polymer and the second polymer of the block copolymer.

In one embodiment, the surface modification layer comprises an additive polymer comprising two or more monomeric or polymeric repeat units that have difference in surface energy of 0.01 to 10 milli-Newton per meter (mN/m), specifically 0.03 to 3 mN/m, and more specifically 0.04 to 1.5 mN/m. For example, neutral layers for polystyrene and polymethylmethacrylate usually comprise styrene and methylmethacrylate, which only have a difference in surface energy of 0.04 mN/m from the respective blocks.

In an embodiment, it is desirable for the additive polymer to form a film with balanced surface tension between the blocks of the block copolymer. Good results will be achieved when the surface tensions are equal. This is the only desired feature and a number of materials can achieve this end result.

In an embodiment, the additive polymer comprises a polymer that comprises a reactive functional group that can react with a functional group upon the surface of the substrate to form a brush on the substrate. The additive polymer is then described as being in the form of a brush on the surface of the substrate.

The additive polymer has a lower number average molecular weight than that of the block copolymer and can comprise a different number of moles of the first monomer or polymer and the second monomer or polymer when compared with the block copolymer.

In an exemplary embodiment, the additive polymer has a number average molecular weight of 5 to 100 kilograms per mole, preferably 7 to 50 kilograms per mole. The polydispersity index for the additive polymer is 1.05 to 2.5, preferably 1.10 to 1.60. When the block copolymer is PS-block-PMMA, the additive polymer can be a copolymer of styrene and methylmethacrylate and comprise 28 to 70 mole percent, preferably 32 to 65 mole percent of polystyrene based on the total number of moles of the additive polymer present in the composition.

Exemplary additive polymers are hydroxyl end-functional poly(styrene-r-methylmethacrylate) (where the "r" between the styrene and the methacrylate stands for "random") or poly(styrene)-r-poly(methyl methacrylate)-r-poly(hydroxyethyl methacrylate).

The block copolymer and the additive polymer can be manufactured in a batch process or in a continuous process. The batch process or the continuous process can involve a single or multiple reactors, single or multiple solvent and single or multiple catalysts (also termed initiators).

In one embodiment, the block copolymer can contain anti-oxidants, anti-ozonants, mold release agents, thermal stabilizers, levelers, viscosity modifying agents, free-radical quenching agents, other polymers or copolymers such as impact modifiers, or the like. The composition can also include an embedded neutral layer to facilitate perpendicular domain orientation in block copolymers having a large mismatch in surface tension of the first and second blocks.

In the preparation of the additive polymer, the third monomer (from which the third polymer is obtained) and/or the fourth monomer (from which the fourth polymer is obtained), the solvent(s) and initiators are added to the reaction vessel in the desired ratios. The contents of the vessel are subjected to heat and agitation to produce the additive polymer. The additive polymer is then precipitated from solution and subjected to further processing as is detailed below.

The block copolymer and the additive polymer after purification may be dissolved in a solvent and then disposed upon the surface of a substrate to form a block copolymer film whose blocks are perpendicular in orientation to the surface of the substrate. In one embodiment, the surface of the substrate may contain a crosslinked mat as an optional surface modification layer) disposed thereon prior to the disposing of the block copolymer onto the surface of the substrate.

In one embodiment, the substrate may contain a layer of a polymer that is crosslinked after being disposed upon the substrate. The layer is formed by disposing a polymer having reactive substituents along the chain backbone capable of reacting either with itself or a crosslink-inducing additive to form bonds or crosslinks between individual chains of the polymer after it is disposed upon the substrate. A layer crosslinked in this manner is then described as being in the form of a mat or mat-like film on the surface of the substrate. This is distinguished from a brush which is not crosslinked on the substrate.

The substrate can also be patterned such that some areas result in perpendicular orientation while others induce a parallel orientation of the domains of the composition. The substrate can also be patterned such that some regions selectively interact, or pin, a domain of the block copolymer to induce order and registration of the block copolymer morphology. The substrate can also have topography that induces the alignment and registration of one or more of the domains of the composition. The composition after being disposed upon the substrate is optionally heated to a temperature of up to 350° C. for up to 4 hours to both remove solvent and to form the domains in an annealing process. Preferred annealing temperatures are dependent on the specific composition of the polymers employed. Generally, annealing is conducted at a temperature above the lowest glass transition temperature of the block copolymer but below the order-disorder transition temperature (i.e. the temperature at which the block copolymer undergoes a transition from an ordered, phase separated state to a homogeneous melt) and the decomposition temperature of the polymers. When PS-b-PMMA is employed as the block copolymer, annealing is generally conducted between 180 to 300° C. The annealing of the composition can be used to vary the interdomain spacing (i.e., the periodicity) of the cylindrical and/or lamellar domains. The size of the domains can also be varied by annealing.

Figure 2:
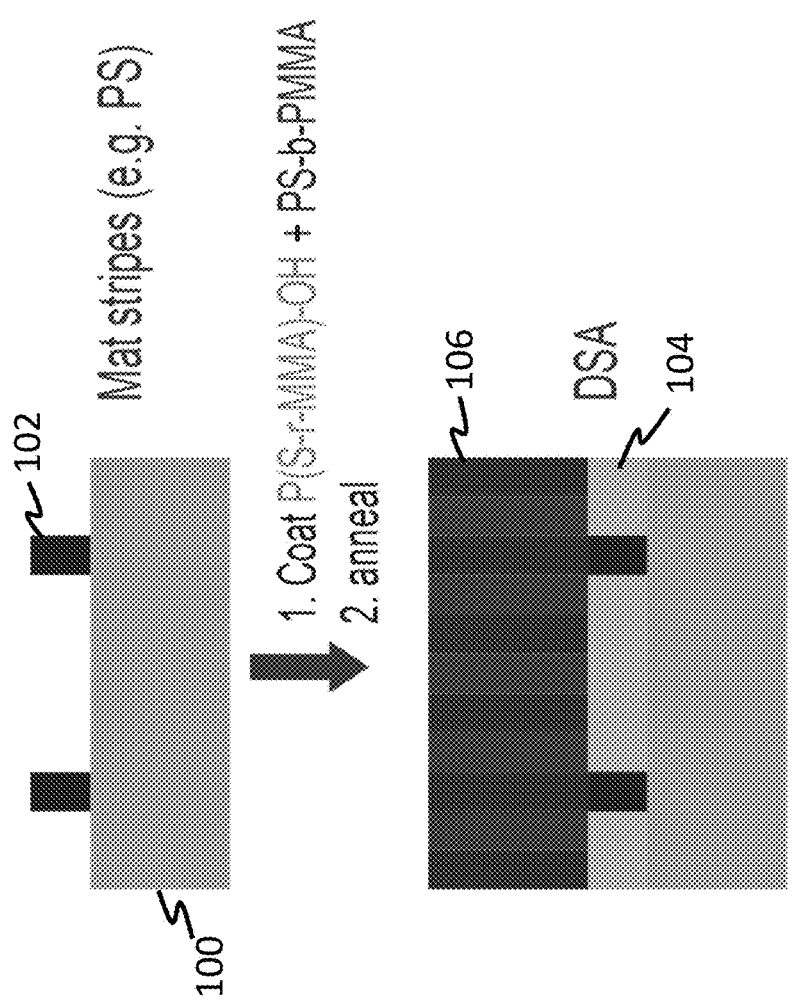
FIG. 2 is a schematic depiction of an exemplary method of patterning a substrate using the composition disclosed herein.

The FIG. 2 depicts an exemplary method of patterning a substrate using the composition disclosed herein. A substrate 100 has disposed upon it mat stripes 102 that act to interact with, or to pin down a domain of the block copolymer. For example, when the block copolymer is poly(styrene-b-methylmethacrylate), the stripes may comprise polystyrene. The composition comprising the block copolymer and the additive polymer is first mixed with a solvent and is then disposed upon the substrate 100. The substrate 100 with the composition disposed thereon is subjected to annealing. During the annealing process, the additive polymer 104 separates from the block copolymer 106 and contacts the surface in much the same manner as the brush copolymer did in the FIG. 1. The block copolymer 106 then undergoes phase separation into domains on the surface of the additive polymer 104.

The solvent that the composition is dissolved in prior to being disposed upon the substrate may be one of those listed above. Examples of useful solvents for compatibilizing the composition are propylene glycol monomethyl ether acetate, propylene glycol monomethyl ether, toluene, anisole, n-butylacetate, isobutylisobutyrate, benzyl benzoate, cyclohexanone, methyl-2-hydroxyIsobutryate, gamma-butyrolactone, propylene glycol ethyl ether, ethyl lactate, and the like. A preferred solvent is propylene glycol monomethyl ether acetate.

The domains of the block copolymer upon annealing form perpendicular to the substrate and the first polymer aligns to the pattern created on the first domain to the "pinning" feature on the substrate, and the second polymer forms a second domain on the substrate aligned adjacent to the first domain. One of the domains of the block copolymer (formed from either the first polymer of the copolymer or the second polymer of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The invention is further illustrated by the following non-limiting examples.

EXAMPLES

The following materials were passed through a column packed with activated A-2 grade alumina before being used in the Examples herein, namely tetrahydrofuran (99.9% pure available from Aldrich), styrene (available from Aldrich), and cyclohexane (HPCL grade available from Fischer). All the other materials used in the Examples herein were commercial materials that were used as received.

The film thicknesses reported in the Examples were measured using a NanoSpec/AFT 2100 Film Thickness Measurement tool. The thickness of the films were determined from the interference of a white light passed through a diffraction grating. A standard program called "Polyimide on Silicon" was used to analyze the component wavelengths (380-780 nm) to determine the film thickness. The thickness of the film of the deposited block copolymer composition and the brush layer were measured together as one polymeric layer. The reported film thickness is the combined thickness of the deposited block copolymer composition and the brush layer.

The number average molecular weight, $M_N$, and polydispersity values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPLC grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Inverse-gated $^{13}C$ NMR spectroscopy was performed on a Bruker Avance 400 MHz NMR spectrometer equipped with a cryoprobe. Polymers were dissolved in $CDCl_3$ in 10 mm NMR tubes at room temperature. 0.02 M chromium acetylacetonate ($Cr(acac)_3$) was added to shorten the acquisition time. The typical sample concentration was 0.35 g/2.8 mL. All measurements were taken without sample spinning at 25° C., acquisition of 4000-8000 scans, relaxation delay of 5 s, 90° pulse length of 12.1 μs, spectrum reference of 77.27 ppm for $CDCl_3$, spectrum center at 100 ppm, and spectral width of 300 ppm.

The annealed films deposited in the Examples were examined using a D5000 Atomic Force Microscope. A 2 μm by 2 μm phase image was collected for each sample at a scan rate of 1 Hz (256×256 pixels). The images were analyzed with Scanned Probe Image Processor (SPIP v 6.0.4, Image Metrology, Denmark). The film pitch, $L_O$, reported in the Examples was determined using Fourier analysis (2D isotropic power spectral density) where the most intense peak in the spectrum representing the dominant spatial wavelength provides the pitch of the material.

Preparation of the Additive
Polymer—P(S-r-MMA)-OH Brush Polymer

Styrene 8.19 g (0.079 mole), methyl methacrylate 11.81 g (0.118 mole), and 4-[1-[[(1,1-dimethylethyl)(2-methyl-1-phenylpropyl)amino]oxy]ethyl]-benzenemethanol (1.02 g, 1.2 mmole of 42.8 wt % stock solution in PGMEA) were added to a reaction flask equipped with a magnetic stirring bar. Reagents were deoxygenated by 3 successive freeze-pump-thaw cycles. The solution was sparged with nitrogen for 15 minutes and then placed in a preheated oil bath at 120° C. for 10 hours, after which the solution was cooled down to room temperature. The reaction mixture was diluted with THF and precipitated from heptane and dried in an oven at 60° C. overnight to yield P(S-r-MMA)-OH-40-20 with the composition and molecular weight as reported in Table 1.

Additional—OH end-functional brush polymers were prepared using the same procedure with modified amounts of styrene and MMA to give brush polymers with a range of composition and molecular weights as indicated in Table 1.

Preparation of the Additive Polymer—poly(styrene)-r-poly(methyl methacrylate)-r-poly(hydoxyethyl methacrylate) brush P(S-r-MMA-r-HEMA)-1

Styrene 8.50 g (0.082 mole), methyl methacrylate 10.10 g (0.101 mole), hydoxyethyl methacrylate 1.40 g (0.011), and 4-[1-[[(1,1-dimethylethyl)(2-methyl-1-phenylpropyl)

amino]oxy]ethyl]-benzenemethanol (0.76 g, 2.1 mmole of 42.8 wt % stock solution in PGMEA) were added to a reaction flask equipped with a magnetic stirring bar. Reagents were deoxygenated by 3 successive freeze-pump-thaw cycles. The solution was sparged with nitrogen for 15 minutes and then placed in a preheated oil bath at 120° C. for 10 hours, after which the solution was cooled down to room temperature. The reaction mixture was diluted with THF and precipitated from heptane and dried in an oven at 60° C. overnight to yield P(S-r-MMA-r-HEMA)-1 with the composition and molecular weight as reported in Table 1. The product copolymer brush exhibited a composition of 42.2 mol % polystyrene, 52.22 mol % polymethyl methacrylate and 5.55 mol % HEMA determined by $^{13}$C NMR.

Preparation of PS-b-PMMA Block Copolymers

Into a 1 liter (L) 3-neck round bottom reactor under an argon atmosphere was added tetrahydrofuran ("THF", 439 g). The THF was then cooled in the reactor to −78° C. The contents of the reactor were then titrated with a 0.35 M solution of sec-butyllithium in cyclohexane until the contents of the reactor exhibited a persistent pale yellow color. The contents of the reactor were then warmed to, and maintained at, 30° C. until the color of the contents completely disappeared (approximately 10-15 minutes). Styrene (12.84 g) was then transferred to the reactor via cannula. The contents of the reactor were then cooled to −78° C. 0.30 g of a Sec-butyllithium solution in cyclohexane (1.25 M) was then rapidly added to the reactor via cannula, causing the reactor contents to turn dark yellow. The resulting exotherm caused the reactor contents to exhibit a 10-15° C. temperature rise within 1 minute of the addition of the sec-butyllithium solution to the reactor. The reactor contents then cooled back down to −78° C. over the following 10 minutes. The reactor contents were allowed to stir for an additional 10 minutes. A small portion of the reactor contents was then withdrawn from the reactor for gel permeation chromatography analysis of the polystyrene block formed. Diphenylethylene (0.1163 g) diluted in cyclohexane (2.72 g) was then transferred to the reactor via cannula, causing the reactor contents to turn from a dark yellow to a dark ruby red. The contents of the reactor were then stirred for 10 minutes at −78° C. Then methyl methacrylate ("MMA") (13.24 g) diluted in cyclohexane (6.93 g) was then transferred into the reactor via cannula. The resulting exotherm caused the reactor contents to warm to −63° C. within 4 minutes of the MMA addition before cooling back down to −76° C. The reactor contents were stirred for an additional 120 minutes, after which the reaction was quenched by the addition of anhydrous methanol. The reactor contents were then precipitated into 1 L of methanol and the solids were collected by vacuum filtration. The resulting filter cake was then dissolved in 150 mL of dichloromethane and washed twice with 100 mL of deionized water. The solution was then transferred into 1 L of methanol and the precipitated solids were collected by vacuum filtration and dried in a vacuum oven at 60° C. overnight to provide PS-b-PMMA-27 with the molecular weight, composition, and pitch as listed in Table 1.

PS-b-PMMA-29 was prepared using the same procedure with modified amounts of reagents as appropriate to give the desired molecular weight and composition listed in Table 1.

TABLE 1

| Polymer Name | Mn (kg/mol) | PDI | mol % PS | Pitch (nm) |
|---|---|---|---|---|
| P(S-r-MMA)-OH-30 | 9.9 | 1.43 | 33 | — |
| P(S-r-MMA)-OH-40 | 8.6 | 1.57 | 43 | — |
| P(S-r-MMA)-OH-50 | 10.2 | 1.32 | 49 | — |
| P(S-r-MMA)-OH-60 | 10.6 | 1.32 | 60 | — |
| P(S-r-MMA)-OH-40-6 | 5.6 | 1.42 | 43 | — |
| P(S-r-MMA)-OH-40-8 | 8.6 | 1.57 | 43 | — |
| P(S-r-MMA)-OH-40-12 | 11.8 | 1.40 | 42 | — |
| P(S-r-MMA)-OH-40-20 | 20.9 | 1.27 | 43 | — |
| P(S-r-MMA-r-HEMA)-1 | 22.5 | 1.30 | 42 | — |
| PS-b-PMMA-27 | 49.1 | 1.13 | 50 | 27 |
| PS-b-PMMA-29 | 52.1 | 1.09 | 50 | 29 |

Comparative Examples A-D

These comparative examples demonstrate a two coat directed self-assembly of PS-b-PMMA. Chemical patterned substrate was prepared by spin coating 1.2 wt % (solids) solutions of the P(S-r-MMA)-OH brush in PGMEA at 1,500 rpm for 1 minute on individual coupons diced from a 12 inch wafer containing chemoepitaxy pattern templates with isolated polystyrene stripes (84 nm pitch, 15 nm CD) prepared using methods described in Liu et al. in Macromolecules, 2011, 44 (7), pp 1876-1885. The P(S-r-MMA)-OH-30, P(S-r-MMA)-OH-40, P(S-r-MMA)-OH-50, P(S-r-MMA)-OH-60 were used as the grafting brush in Comparative Examples A-D, respectively (Table 1). The templated substrate was baked at 150° C. for 1 min and annealed at 250° C. under nitrogen for 5 minutes. The substrate was then soaked in PGMEA for 1 min, spun dry at 3,000 rpm for 1 min and baked at 150° C. for 1 min. Lamellae PS-b-PMMA of 28 nm domain spacing (PS-b-PMMA-28) was prepared by blending PS-b-PMMA-27 and PS-b-PMMA-29 at 1:1 weight ratio (where the "27" and "29" denote the spacing of the respective block copolymers in nanometers).

PS-b-PMMA-28 was dissolved in PGMEA to form a 1.5 wt % solution. The solution was then spin-coated at 4,400 rpm onto the chemical patterned substrate described above. The coated film was baked at 110° C. for 1 min and annealed at 250° C. for 5 minutes under nitrogen and placed on a stainless steel block rapidly to be cooled to room temperature. The resulting film was examined using by atomic force microscopy a D5000 AFM tool (See FIG. 3a-3d). These images reveal a narrow window in terms of the brush composition to achieve good directed self-assembly (DSA), as only the Comparative B with P(S-r-MMA)-OH-40 showed low defectivity DSA while other brushes showed poor alignment and many defects.

Examples 1-4

This example is directed to the present invention and involves a one coat directed self-assembly of PS-b-PMMA (PS-block-PMMA). Lamellar PS-b-PMMA of 28 nm domain spacing (PS-b-PMMA-28) was prepared by blending PS-b-PMMA-27 and PS-b-PMMA-29 at 1:1 weight ratio. PS-b-PMMA-28 and P(S-r-MMA)-OH (poly(styrene-random-methylmethacrylate)-OH) brush (with PS-b-PMMA-28 at a weight ratio of 4:1 relative to the P(S-r-MMA)-OH brush) were dissolved in propylene glycol methyl ether acetate (PGMEA) to form a 1.5 wt % solution. P(S-r-MMA)-OH-30, P(S-r-MMA)-OH-40, P(S-r-MMA)-OH-50, P(S-r-MMA)-OH-60 were used as the blending brush in Examples 1-4, respectively. The blend formulations were then spin-coated @ 3,600 rpm onto individual coupons diced from a 12 inch wafer containing chemoepitaxy pattern templates with isolated polystyrene stripes (84 nm pitch, 15 nm CD) prepared using methods described in Liu et al. in *Macromolecules,* 2011, 44 (7), pp 1876-1885. The coated films were baked at 110° C. for 1 minute and annealed at 160° C. for 5 minutes and then 250° C. for 5 minutes under nitrogen and placed on a stainless steel block rapidly to be cooled to room temperature. The resulting films were examined by atomic force microscopy using a D5000 AFM tool (FIG. 3e-3h). These images exemplify the invention as they reveal a much broader process window in terms of the brush composition to achieve good directed self-assembly (DSA) for one coat process with the blend of block copolymer and brush. All tested brushes produced aligned lamella with low defectivity, which is in sharp contrast to the Comparative Examples that showed poor alignment for three of the four brushes.

Examples 5-6

Figure 3:
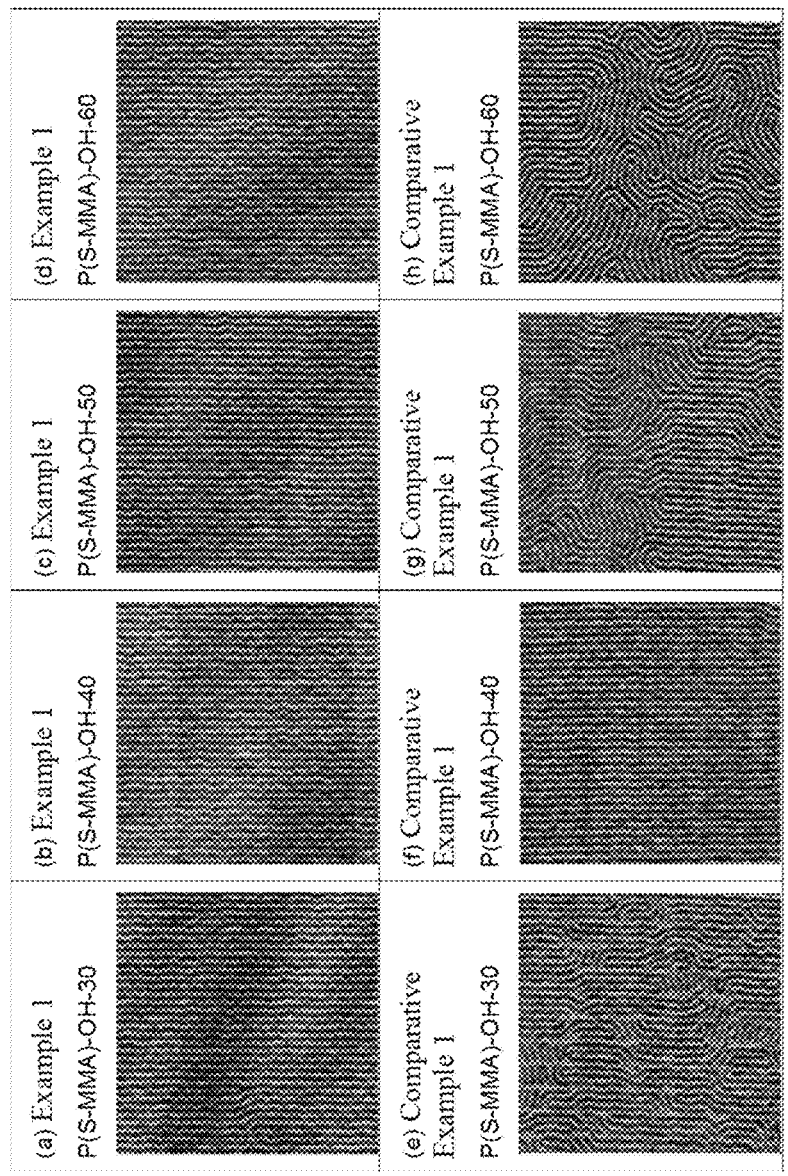
FIG. 3 depicts a series of photomicrographs that compare atomic force microscope (AFM) images of DSA of PS-b-PMMA using one coat process and two coat process; (a) Example 1, using brush P(S-MMA)-OH-30; (b) Example 1, using brush P(S-MMA)-OH-40; (c) Example 1, using brush P(S-MMA)-OH-50; (d) Example 1, using brush P(S-MMA)-OH-50; (e) Comparative Example 1, using brush P(S-MMA)-OH-30; (f) Comparative Example 1, using brush P(S-MMA)-OH-40; (g) Comparative Example 1, using brush P(S-MMA)-OH-50; (h) Comparative Example 1, using brush P(S-MMA)-OH-60.
Figure 4:
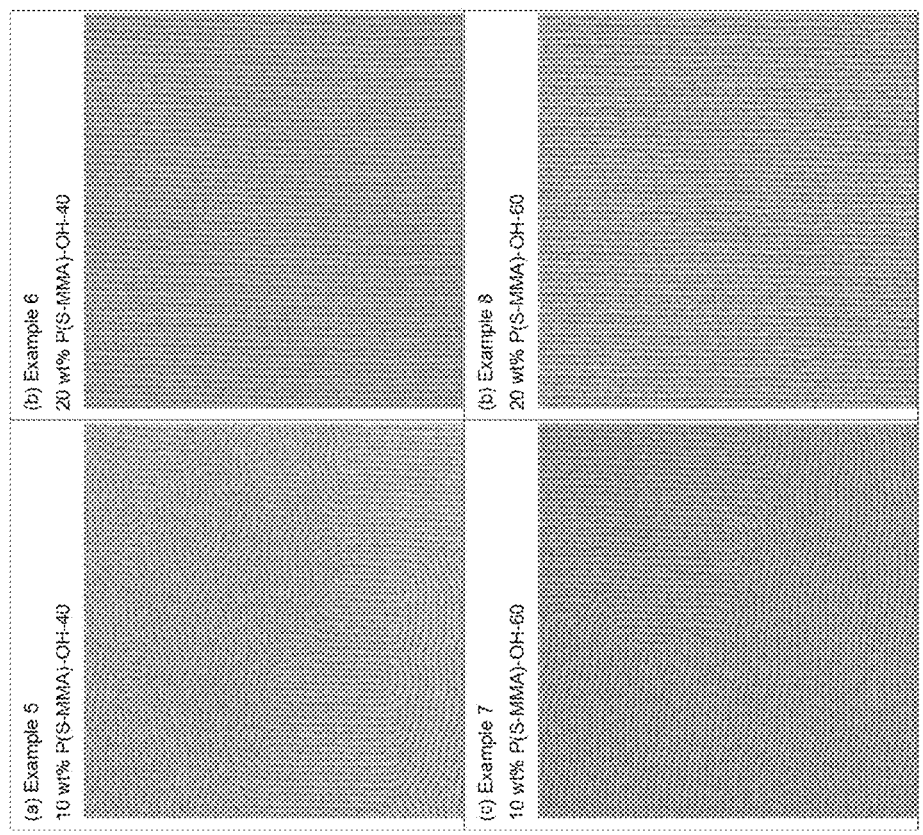
FIG. 4 depicts a comparison of micrographs from DSA of PS-b-PMMA-28 using one coat process with varying amount of brush; including (a) Example 5, using 10 wt % P(S-MMA)-OH-40; (b) Example 6, using 20 wt % P(S-MMA)-OH-40; (c) Example 7, using 10 wt % P(S-MMA)-OH-60; and (d) Example 8, using 20 wt % P(S-MMA)-OH-60.
Figure 5:
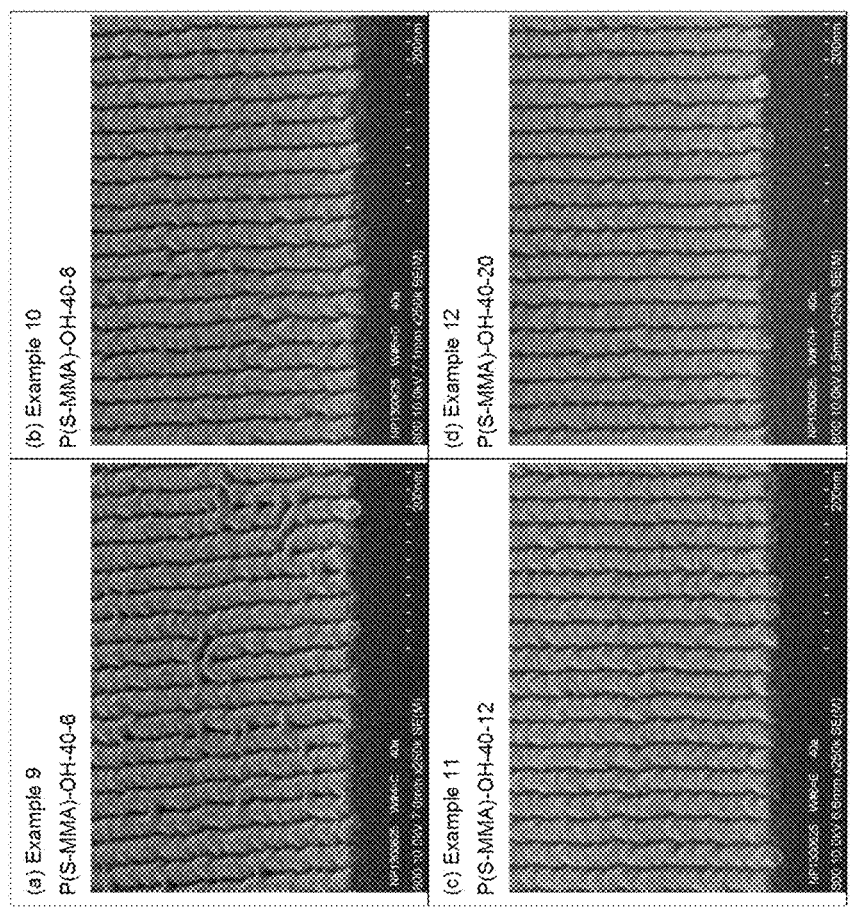
FIG. 5 is a series of photomicrographs that compare AFM images of DSA of PS-b-PMMA using the one coat process, including (a) Example 9 with P(S-MMA)-OH-40-6; (b) Example 10 using brush P(S-MMA)-OH-40-8; (c) Example 11 using brush P(S-MMA)-OH-43-12; and (d) Example 12 using brush P(S-MMA)-OH-40-20.

These examples are directed to brush composition optimization for one coat directed self-assembly using P(S-r-MMA)-OH-40. To investigate the impact of the brush/BCP ratio in the one coat process, we explored two different brush concentrations with P(S-r-MMA)-40. Lamellar PS-b-PMMA of 28 nm domain spacing (PS-b-PMMA-28) was prepared by blending PS-b-PMMA-27 and PS-b-PMMA-29 at 1:1 weight ratio. PS-b-PMMA-28 and P(S-r-MMA)-OH-40 brush were dissolved in propylene glycol methyl ether acetate (PGMEA) to form a 1.5 wt % solution containing 10 wt % and 20% (weight ratio of 9:1 and 4:1, respectively, of PS-b-PMMA relative to P(S-r-MMA)-OH brush) loading relative to total solid for Examples 5 and 6, respectively. The blend formulations were then spin-coated @ 3,600 rpm onto individual coupons diced from a 12 inch wafer containing chemoepitaxy pattern templates with isolated polystyrene stripes (84 nm pitch, 15 nm CD) prepared using methods described in Liu et al. in *Macromolecules,* 2011, 44 (7), pp 1876-1885. The coated films were baked at 110° C. for 1 min and annealed at 160° C. for 5 minutes and then 250° C. for 5 minutes under nitrogen and placed on a stainless steel block rapidly to be cooled to room temperature. PMMA was removed by reactive ion etching (RIE) using a PlasmaTherm 790i RIE with an $O_2$ plasma (6 mTorr, 90 W) RIE treatment for 16 seconds post plasma stabilization. The plasma treated films were then examined using an AMRAY 1910 Field Emission scanning electron microscope (SEM). The test samples were mounted on the SEM stage using double sided carbon tape and cleaned by blowing nitrogen prior to analysis. An image of each of the test samples was collected at 50,000× magnification. Representative micrographs are shown in FIG. 4a-4b. These images reveal that more than 10% brush is required to achieve good DSA results for this formulation. Many defects and misaligned lamella were observed for Example 5 with 10 wt % brush loading in FIG. 3a, while Example 6 with 20 wt % brush loading in FIG. 3b showed defect-free DSA.

Examples 7-8

These examples are directed to a brush composition optimization for one coat directed self-assembly using P(S-r-MMA)-OH-60. To investigate the impact of brush/BCP ratio in the one coat process, we explored two different brush concentrations with P(S-r-MMA)-60. Lamellar PS-b-PMMA of 28 nm domain spacing (PS-b-PMMA-28) was prepared by blending PS-b-PMMA-27 and PS-b-PMMA-29 at 1:1 weight ratio. PS-b-PMMA-28 and P(S-r-MMA)-OH-60 brush were dissolved in propylene glycol methyl ether acetate (PGMEA) to form a 1.5 wt % solution containing 10 wt % and 20% (weight ratio of 9:1 and 4:1, respectively, of PS-b-PMMA relative to P(S-r-MMA)-OH brush) loading relative to total solid for Examples 5 and 6, respectively. The blend formulations were then spin-coated @ 3,600 rpm onto individual coupons diced from a 12 inch wafer containing chemoepitaxy pattern templates with isolated polystyrene stripes (84 nm pitch, 15 nm CD) prepared using methods described in Liu et al. in *Macromolecules,* 2011, 44 (7), pp 1876-1885. The coated films were baked at 110° C. for 1 min and annealed at 160° C. for 5 minutes and then 250° C. for 5 minutes under nitrogen and placed on a stainless steel block rapidly to be cooled to room temperature. PMMA was removed by reactive ion etching (RIE) using a PlasmaTherm 790i RIE with an $O_2$ plasma (6 mTorr, 90 W) RIE treatment for 16 seconds post plasma stabilization. The plasma treated films were then examined using an AMRAY 1910 Field Emission scanning electron microscope (SEM). The test samples were mounted on the SEM stage using double sided carbon tape and cleaned by blowing nitrogen prior to analysis. An image of each of the test samples was collected at 50,000× magnification. Representative micrographs are shown in FIG. 4c-4d. These images reveal that more than 10% brush is required to achieve good DSA results for this formulation as well. Many defects and misaligned lamella were observed for Example 7 with 10 wt % brush loading in FIG. 4c, while Example 8 with 20 wt % brush loading in FIG. 4d showed defect-free DSA.

Examples 9-12

These examples are directed to one coat directed self-assembly of PS-b-PMMA. To identify the brush molecular weight required to demonstrate successful DSA with the one coat process, a series of brushes at similar composition but different molecular weight were examined. Lamellar PS-b-PMMA of 28 nm domain spacing (PS-b-PMMA-28) was prepared by blending PS-b-PMMA-27 and PS-b-PMMA-29 at 1:1 weight ratio. PS-b-PMMA-28 and P(S-r-MMA)-OH brushes (20 wt % loading relative to total solid, weight ratio of 4:1 of PS-b-PMMA relative to P(S-r-MMA)-OH brush) were dissolved in propylene glycol methyl ether acetate (PGMEA) to form a 1.5 wt % solution. P(S-r-MMA)-OH-40-6, P(S-r-MMA)-OH-40-8, P(S-r-MMA)-OH-40-12, and P(S-r-MMA)-OH-40-20 were used as the blending brush in Examples 9-12, respectively. The blend formulations were then spin-coated @ 3,600 rpm onto individual coupons diced from a 12 inch wafer containing chemoepitaxy pattern templates with isolated polystyrene stripes (84 nm pitch, 15 nm CD) prepared using methods described in Liu et al. in *Macromolecules,* 2011, 44 (7), pp 1876-1885. The coated films were baked at 110° C. for 1 minute and annealed at 160° C. for 5 minutes and then 250° C. for 5 minutes under nitrogen and placed on a stainless steel block rapidly to be cooled to room temperature. PMMA was removed by reactive ion etching (RIE) using a PlasmaTherm 790i RIE with an $O_2$ plasma (6 mTorr, 90 W) RIE treatment for 16 seconds post plasma stabilization. The plasma treated films were then examined using an AMRAY 1910 Field Emission scanning electron microscope (SEM). The test samples were mounted on the SEM stage using double sided carbon tape and cleaned by blowing nitrogen prior to analysis. An image of each of the test samples was collected at 50,000× magnification. Representative micrographs are shown in FIGS. 5a-5d. The lowest molecular weight brush used in Example 9 showed more defects in the form of bridging between lines, presumably due to migration of the brush to the top surface of the block copolymer (i.e. the polymer-air interface). However, the higher molecular weight brushes used in Examples 10-12 did not show evidence of line bridging.

Example 13

Figure 6:
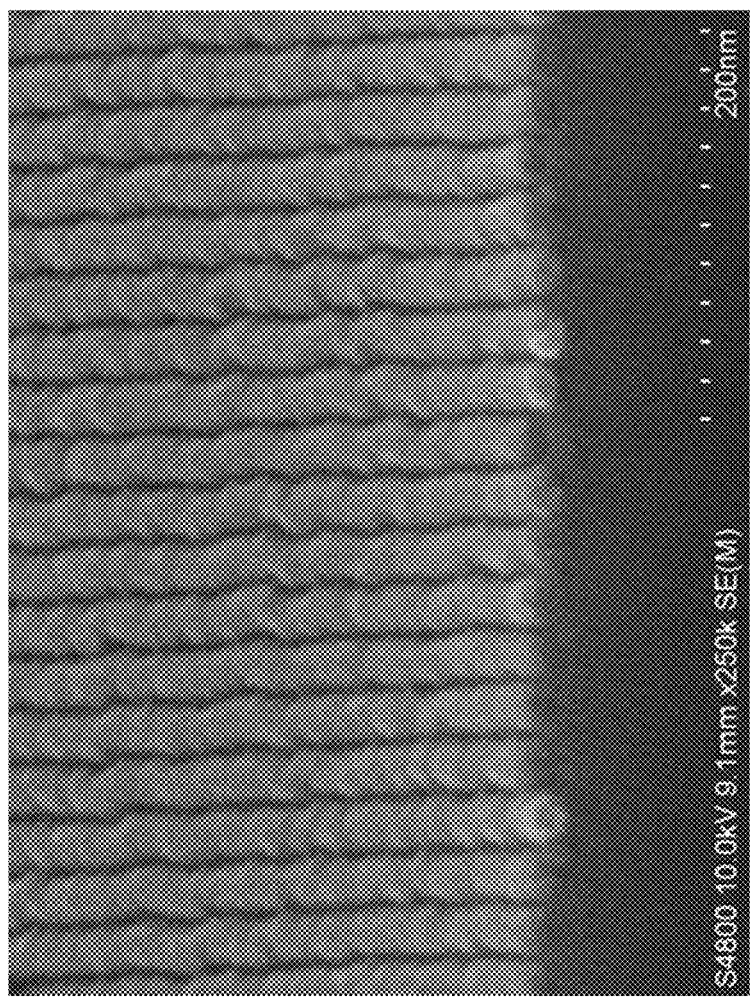
FIG. 6 shows a scanning electron microscope (SEM) micrograph from Example 13 demonstrating good DSA from PS-b-PMMA-28 using the one coat process with P(S-MMA-r-HEMA)-1.

This example is directed to a one coat directed self-assembly of PS-b-PMMA. Lamellar PS-b-PMMA of 28 nm domain spacing (PS-b-PMMA-28) was prepared by blending PS-b-PMMA-27 and PS-b-PMMA-29 at 1:1 weight ratio. PS-b-PMMA-28 and P(S-r-MMA-r-HEMA)-1 brush (20 wt % loading relative to total solid, weight ratio of 4:1 of PS-b-PMMA relative to P(S-r-MMA)-OH brush) were dissolved in propylene glycol methyl ether acetate (PGMEA) to form a 1.5 wt % solution. The blend formulations were then spin-coated @ 3,600 rpm onto an individual coupon diced from a 12 inch wafer containing chemoepitaxy pattern templates with isolated polystyrene stripes (84 nm pitch, 15 nm CD) prepared using methods described in Liu et al. in *Macromolecules*, 2011, 44 (7), pp 1876-1885. The coated film was baked at 110° C. for 1 minute and annealed at 160° C. for 5 minutes and then 250° C. for 5 minutes under nitrogen and placed on a stainless steel block rapidly to be cooled to room temperature. PMMA was removed by reactive ion etching (RIE) using a PlasmaTherm 790i RIE with an $O_2$ plasma (6 mTorr, 90 W) RIE treatment for 16 seconds post plasma stabilization. The plasma treated films were then examined using an AMRAY 1910 Field Emission scanning electron microscope (SEM). The test samples were mounted on the SEM stage using double sided carbon tape and cleaned by blowing nitrogen prior to analysis. An image of each of the test samples was collected at 50,000× magnification. Representative micrographs are shown in FIG. 6. This micrograph demonstrates the P(S-r-MMA-r-HEMA) brush is effective to achieve good directed self-assembly (DSA) in the one coat process when blended with the block copolymer.

Comparative Example E

Figure 7:
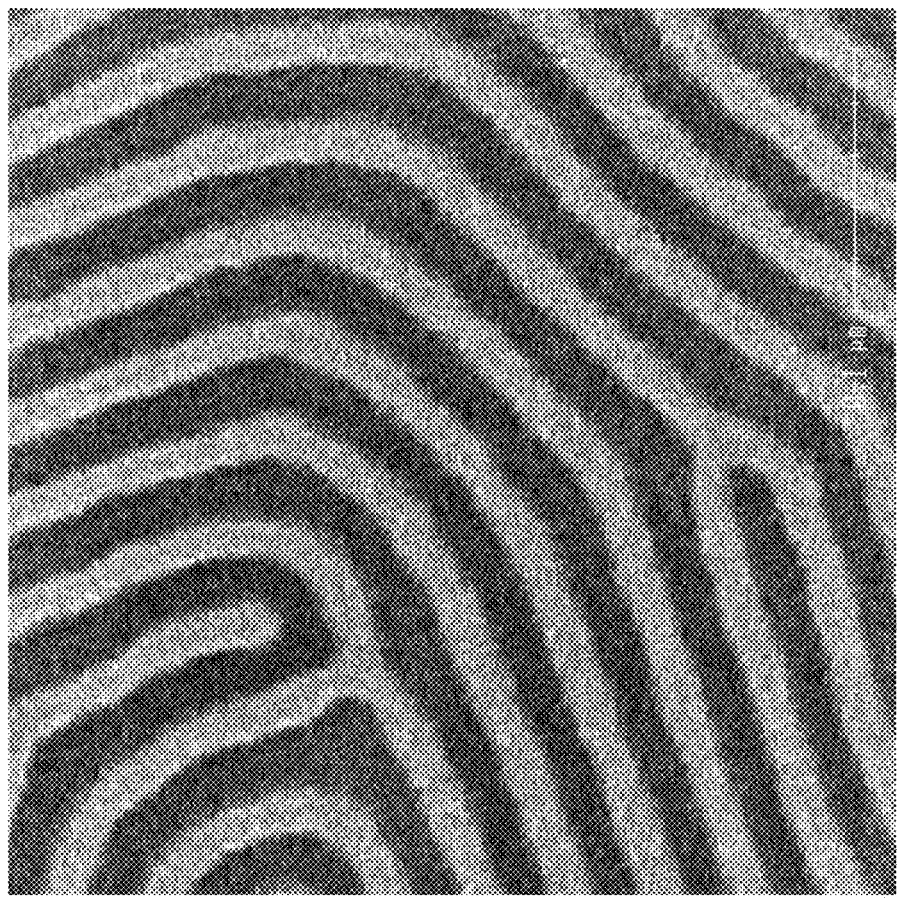
FIG. 7 depicts a scanning electron microscope image of a fingerprint pattern formed by the oxidized PDMS.

This comparative example demonstrates a two coat directed self-assembly of a block copolymer of polystyrene and polydimethylsiloxane (PS-b-PDMS). A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. A solution of PS—OH-1 (Mn=10 kg/mol) in PGMEA was prepared at 1.2 wt %. The PS—OH-1 solution was spin-coated at 1,500 rpm onto a silicon wafer with native oxide coating. The coated film was baked at 250° C. for 2 minutes under nitrogen and placed on a stainless steel block rapidly to be cooled to room temperature. The wafer was then rinsed with PGMEA by coating a puddle on the wafer and spinning dry after 30 seconds puddle time and then soft baked at 130° C. for 1 minute to remove residual solvent. The PS-brushed wafer was then coated with a thin film of PS-b-PDMS-34 by spin coating at 1,000 rpm, soft baked at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 7, which shows a fingerprint pattern formed by the oxidized PDMS.

Example 14

Figure 8:
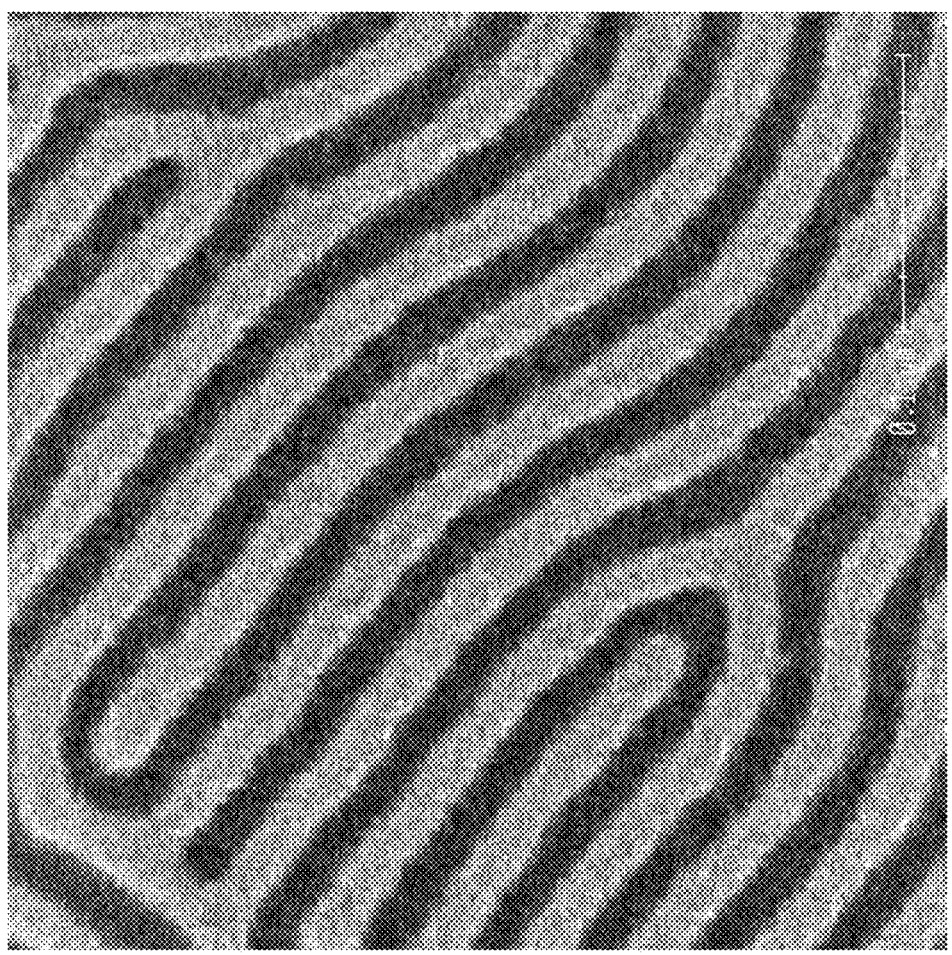
FIG. 8 depicts a scanning electron microscope image of a fingerprint pattern formed by the oxidized PDMS with no degradation of the pattern.

A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. PS—OH-1 (0.030 g), was added to 10 g of this solution to form a solution containing both the PS-b-PDMS-34 and PS—OH-1 brush. A silicon wafer with native oxide coating was coated with a thin film of the composition by spin coating at 1,000 rpm, soft baking at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 8, which shows a fingerprint pattern formed by the oxidized PDMS and no degradation of the pattern. This demonstrates the composition of block copolymer and brush can be used to eliminate the two step process of coating and annealing the brush and block copolymer in separate steps, thereby greatly reducing overall processing cost.

Example 15

Figure 9:
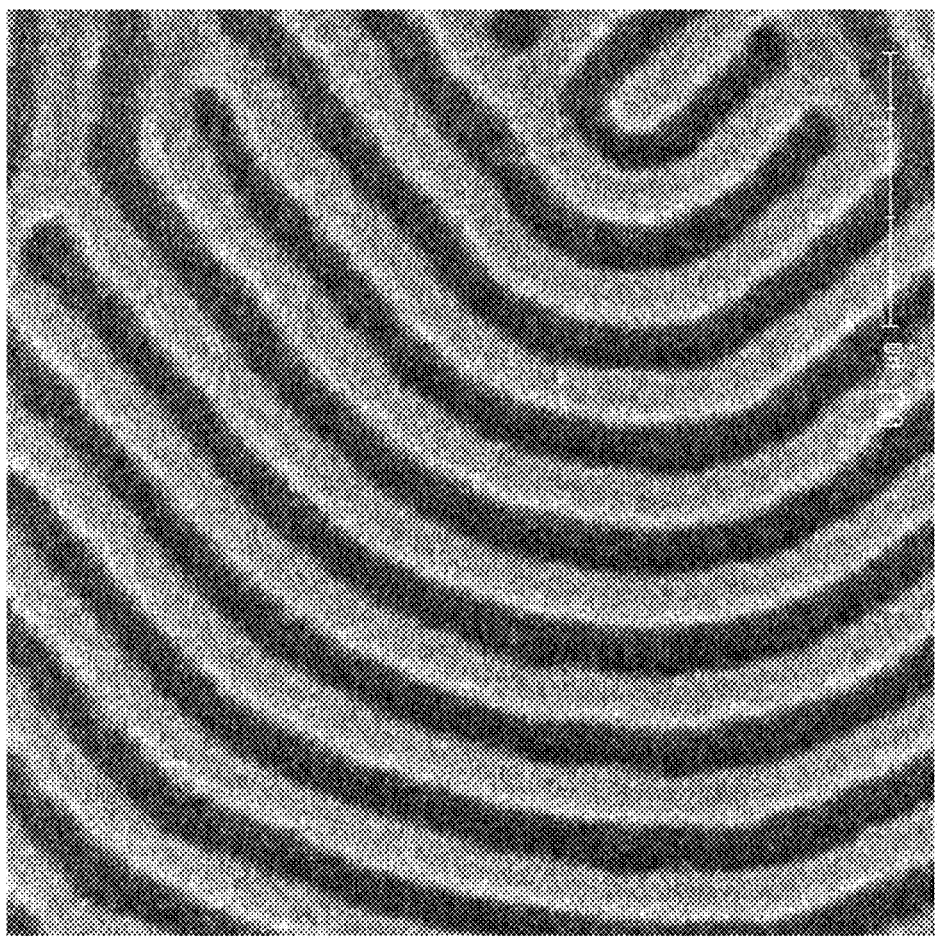
FIG. 9 too depicts a scanning electron microscope image of a fingerprint pattern formed by the oxidized PDMS with no degradation of the pattern.

A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. PS—OH-2 (0.050 g), was added to 10 g of this solution to form a solution containing both the PS-b-PDMS-34 and PS—OH-2 brush. A silicon wafer with native oxide coating was coated with a thin film of the composition by spin coating at 1,000 rpm, soft baking at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 9, which shows a fingerprint pattern formed by the oxidized PDMS and no degradation of the pattern. This demonstrates the composition of block copolymer and brush can be used to eliminate the two step process of coating and annealing the brush and block copolymer in separate steps, thereby greatly reducing overall processing cost.

What is claimed is:
1. A composition comprising:
    an intimate mixture of complete volumes of a block copolymer; where the block copolymer comprises a first polymer and a second polymer; where the first polymer and the second polymer of the block copolymer are different from each other and the block copolymer forms a phase separated structure;
    an additive polymer comprising a homopolymer or a random copolymer; wherein the average surface energy of the additive polymer lies between the surface energy of the first polymer and the surface energy of the second polymer of the block copolymer; where the additive polymer comprises a reactive functional moiety that forms a bond or a complex or a coordinate with the substrate upon being disposed on the substrate; where the reactive functional moiety is unreacted when it is a part of the composition; where the block copolymer is present in the composition in a weight ratio of 2:1 to 5:1 relative to the additive polymer; and a solvent.

2. The composition of claim 1, where the additive polymer is a copolymer that comprises a third polymer and a fourth polymer; where the third polymer and the fourth polymer of the additive polymer are different from each other; where the first polymer of the block copolymer is chemically identical with or substantially chemically similar to the third polymer of the additive polymer or where the second polymer of the block copolymer is chemically identical with or substantially chemically similar to the fourth polymer of the additive polymer.

3. The composition of claim 2, where the first polymer and the third polymer is a vinyl aromatic polymer obtained by a polymerization of units having a structure of formula (1):

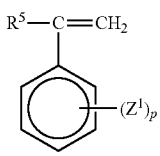

(1)

wherein $R^5$ is hydrogen, an alkyl, a haloalkyl or halogen; $Z^1$ is hydrogen, halogen, a hydroxyl, a haloalkyl or an alkyl; and p is from 1 to about 5.

4. The composition of claim 2, where the second polymer and the fourth polymer is obtained from a polymerization of units having a structure represented by formula (2):

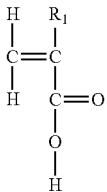

(2)

where $R_1$ is a hydrogen or an alkyl group having 1 to 10 carbon atoms; or where the second polymer has a structure derived from a monomer having a structure represented by the formula (3):

(3)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group.

5. The composition of claim 1, where the additive polymer is hydroxyl end-functionalized poly(styrene-r-methylmethacrylate) or a hydroxyl end-functionalized poly(styrene)-r-poly(methyl methacrylate)-r-poly(hydroxyethyl methacrylate).

6. The composition of claim 1, where the additive polymer has a lower molecular weight than the block copolymer.

7. The composition of claim 1, where the additive polymer is a random copolymer that comprises different polymers where a surface energy of respective polymers are higher and lower than those of the first polymer and the second polymer of the block copolymer respectively.

8. The composition of claim 1, where first polymer and the second polymer is present in the block copolymer in an amount sufficient to form a cylindrical morphology, where the first polymer is present in an amount of 15 to 35 wt %, and wherein the second polymer is present in the block copolymer in an amount of 85 to 65 wt %, based on the total weight of the block copolymer.

9. The composition of claim 1, where first polymer and the second polymer is present in the block copolymer in an amount sufficient to form a lamellar morphology, where the first polymer is present in an amount of 35 to 65 wt %, and wherein the second polymer is present in the block copolymer in an amount of 35 to 65 wt %, based on the total weight of the block copolymer.

* * * * *